United States Patent
Thiele

(10) Patent No.: US 7,099,425 B2
(45) Date of Patent: Aug. 29, 2006

(54) ADJUSTMENT CIRCUIT AND METHOD FOR TUNING OF A CLOCK SIGNAL

(75) Inventor: Frank Thiele, München (DE)

(73) Assignee: Infineon Technologies AG, Munich (DE)

( * ) Notice: Subject to any disclaimer, the term of this patent is extended or adjusted under 35 U.S.C. 154(b) by 761 days.

(21) Appl. No.: 10/200,632

(22) Filed: Jul. 22, 2002

(65) Prior Publication Data

US 2003/0026355 A1 Feb. 6, 2003

(30) Foreign Application Priority Data

Jul. 20, 2001 (DE) ................ 101 35 582

(51) Int. Cl.
*H04L 25/40* (2006.01)
*H04L 27/06* (2006.01)
*H04D 3/24* (2006.01)

(52) U.S. Cl. .......... 375/372; 375/373; 375/340

(58) Field of Classification Search ......... 375/354, 375/355, 371, 373, 376, 377, 224, 226, 372, 375/340; 711/100, 155, 154, 109, 101–105, 711/200–211; 702/108, 117, 119; 709/200; 365/233, 189.01; 327/141, 144, 155, 156, 327/146, 149, 159

See application file for complete search history.

(56) References Cited

U.S. PATENT DOCUMENTS 5,604,775 A 2/1997 Saitoh et al.
5,815,427 A * 9/1998 Cloud et al. ............... 365/51
5,991,221 A * 11/1999 Ishikawa et al. ........... 365/226
6,144,595 A * 11/2000 Hirooka et al. ............ 365/201
6,212,482 B1 * 4/2001 Manning ................ 702/182
6,369,627 B1 * 4/2002 Tomita .................... 327/158
6,385,125 B1 * 5/2002 Ooishi et al. ............. 365/233
6,388,482 B1 * 5/2002 Schnell et al. ............ 327/158
6,486,651 B1 * 11/2002 Lee et al. ............... 324/76.53
6,628,154 B1 * 9/2003 Fiscus .................... 327/158
2001/0040829 A1 * 11/2001 Arimoto et al. .......... 365/189.02
2002/0013946 A1 * 1/2002 Morisada et al. ............ 725/73
2003/0028710 A1 * 2/2003 Shinohara et al. .......... 711/104

FOREIGN PATENT DOCUMENTS

| DE | 197 14 467 A1 | 10/1998 |
| DE | 198 11 868 C2 | 10/1998 |
| EP | 0 306 662 B1 | 3/1989 |
| WO | WO 85/00709 | 2/1985 |

* cited by examiner

*Primary Examiner*—Tesfaldet Bocure
*Assistant Examiner*—Vineeta Panwalkar
(74) *Attorney, Agent, or Firm*—Laurence A. Greenberg; Werner H. Stemer; Ralph E. Locher

(57) ABSTRACT

An integrated circuit and a method for tuning an internal clock signal with respect to data that is to be emitted includes an adjustment circuit with a compensating circuit for synchronizing the internal clock signal with respect to the data that is to be emitted. Setting data, which is dependent on first adjustment data and on second adjustment data, is applied to the compensating circuit. The first adjustment data is determined using a tuning method during the front-end test, and is stored in a read only memory. The second adjustment data is determined in a fine-tuning method in the finished manufactured component, and is stored in a read/write memory.

18 Claims, 1 Drawing Sheet

ADJUSTMENT CIRCUIT AND METHOD FOR TUNING OF A CLOCK SIGNAL

BACKGROUND OF THE INVENTION

Field of the Invention

The invention relates to an adjustment circuit for an integrated circuit for tuning of a clock signal. The invention also relates to a method for tuning of a clock signal with respect to data that is to be emitted, in an integrated circuit.

In integrated circuits, data is normally emitted at the data outputs with respect to a chip-internal reference clock. The chip-internal reference clock is produced in the integrated circuit by, for example, a Delay Locked Loop (DLL), from which a reference clock is derived for all the outputs.

The chip-internal reference clock is adjusted during the front-end test by the setting of setting memories, which are referred to as fuses. During the front-end test, the integrated circuits are tested on the substrate wafer, before these circuits are separated. The fuses represent read only memories, whose contents can substantially be written to only once, and are then stored permanently. Once the integrated circuits have been separated, access to these fuses is possible only subject to stringent conditions.

The adjustment of the chip-internal reference clock is a significant factor for the stability of the integrated circuits in the application and in the overall system. Once the integrated circuits have been separated and have been installed in appropriate housings, fine adjustment of the chip-internal reference clock is impossible because the adjustment process is carried out exclusively through the fuse setting.

SUMMARY OF THE INVENTION

It is accordingly an object of the invention to provide an adjustment circuit and method for tuning of a clock signal that overcomes the hereinafore-mentioned disadvantages of the heretofore-known devices and methods of this general type and that carries out fine adjustment of the chip-internal reference clock.

With the foregoing and other objects in view, there is provided, in accordance with the invention, an integrated circuit for tuning emitted data including an adjustment circuit having a read only memory storing first adjustment data, an internal clock signal, and a compensating circuit synchronizing the internal clock signal with respect to the data to be emitted, a read/write memory storing second adjustment data, the adjustment circuit adapted to supply setting data dependent upon the first adjustment data and the second adjustment data and to tune the internal clock signal, and the adjustment circuit applying the setting data to the compensating circuit.

The invention relates to an adjustment circuit for an integrated circuit for tuning of an internal clock signal. The adjustment circuit has a compensating circuit to synchronize the clock signal with respect to data that is to be emitted. For such a purpose, setting data is applied to the compensating circuit, with the setting data being dependent on first adjustment data and on second adjustment data. The first adjustment data is stored in a read only memory, and the second adjustment data is stored in a read/write memory.

With the objects of the invention in view, there is also provided a method for tuning an internal clock signal with respect to data to be emitted in an integrated circuit, including the steps of tuning the internal clock signal with respect to data to be emitted in a front-end test step, determining first adjustment data, storing the first adjustment data, fine-tuning the internal clock signal with respect to the data to be emitted, determining second adjustment data, storing the second adjustment data, and setting the internal clock signal as a function of the first adjustment data and the second adjustment data.

The method tunes an internal clock signal with respect to data that is to be emitted, in an integrated circuit. According to the invention, the internal clock signal is first of all tuned with respect to data that is to be emitted, in a front-end test step, that is to say, for example, in a test procedure at wafer level. The tuning procedure results in first adjustment data, which is described in the following text, so that the clock signal remains tuned with respect to the data that is to be emitted. Then, that is to say, for example, after the integrated circuits have been separated and installed in their housings, the clock signal is finely tuned with respect to the data that is to be emitted. This is used to determine second adjustment data, which is likewise stored. The internal clock signal is then set as a function of the first adjustment data and of the second adjustment data such that it is tuned with respect to the data that is to be emitted.

Fine-tuning of the clock signal during the front-end test is difficult. The test technique for determining the settings is highly complex, and even greater complexity must be provided, in terms of the test equipment and the test procedure, for finer tuning of the internal clock signal. Furthermore, the size of the read only memory in the integrated circuit would have to be increased above the previously normal size to provide the adjustment data required for fine adjustment.

The advantage of the present invention is that the clock signal is firstly tuned roughly with respect to the data that is to be emitted, during the front-end test, and fine-tuning is then carried out in the back end test, that is to say, after the integrated circuits have been separated and, for example, after they have been installed in a housing.

During the fine-tuning process, second adjustment data is determined, and is written to a read/write memory. This firstly allows the particular effort for fine-tuning to be moved from the front-end test procedure to the back end test procedure. As a result, the entire front-end test procedure for the integrated component, that is to say, the test procedure at wafer level, becomes more effective.

Thus, by way of example, all the integrated circuits are tested on the substrate wafer during the front-end test, that is to say, including those which are damaged or destroyed during or after the separation process and installation in the appropriate housing, and which, thus, cannot be used any further. According to the method on which the invention is based, the fine-tuning of the integrated circuit is carried out only after the complete processing and after the integrated circuit has been processed to its final form so that, with the final testing of the integrated circuit in its correct form, no test time is used to test defective components.

A further advantage is that the timing parameters, that is to say, also the phase shift of an internal clock signal, of an electronic component, that is to say, of an integrated circuit with its housing, can be changed by the process of installing it in a housing so that the usefulness of fine-tuning previously carried out during the front-end test procedure would be restricted.

Furthermore, the second adjustment data, which is intended for fine-tuning, may vary during operation of the integrated circuit to take into account changes in circuit parameters resulting from temperature, aging, or the like. As such, the assessment of a data eye can be varied in system conditions during operation (fine adjustment). These system conditions cannot be simulated either in front-end testing or in back end testing when using test equipment.

System analyses have shown that the system performance and stability can be improved if the data eye is shifted with respect to the clock signal by a fixed value that can be determined in system conditions, for example, by an advance value of 50 ps. Such a value can be determined and optimized by system analyses and cannot be optimized or set during the conventional setting process through fuses (write once).

In accordance with another feature of the invention, the read only memory has a settable fuse to be set during a test procedure.

In accordance with a further feature of the invention, the read/write memory preferably includes a register that contains test mode information during a test procedure. The test mode information may firstly be written by a self-test device, which is integrated on the integrated circuit, or by, for example, an external test device that is connected to the integrated circuit. It is, thus, possible to save additional read only or fuse memory cells, that is to say, chip surface area because the test mode register is used to accommodate data for the fine-tuning of the adjustment circuit, while the integrated circuit is in normal operation, and the test mode registers would otherwise not be used.

It is also possible to provide for the compensating circuit to be connected to a clock production circuit, which produces the clock signal and matches its phase and frequency to the data that is to be emitted. It is also possible to provide for the clock production circuit to have a DLL, which shifts the phase of an external clock signal in accordance with the setting data, and provides this as an internal clock signal.

In accordance with an added feature of the invention, the adjustment circuit may have a setting circuit, which is connected to the compensating circuit to produce the setting data from the first adjustment data and from the second adjustment data in accordance with a predetermined function. In the simplest case, the predetermined function lies only in the first adjustment data and the second adjustment data being joined together. However, other functions are also feasible, from which setting data can be produced, by which the compensating circuit tunes the clock signal with respect to data that is to emit.

In accordance with an additional mode of the invention, the first and second adjustment data are processed in accordance with a function for setting data, and the internal clock signal is tuned with the setting data.

In accordance with yet another mode of the invention, the first adjustment data is stored in a nonvolatile manner, and the second adjustment data is stored in a volatile manner.

In accordance with yet a further mode of the invention, the step of fine-tuning the internal clock signal is carried out by optimizing the second adjustment data, with the optimization method preferably being started by the first adjustment data. Such an optimization method may, for example, be an iterative method, in which case the internal clock signal is finely tuned iteratively by step-by-step checking of the tuning of the internal clock signal with respect to the data that is to be emitted.

In accordance with yet an added mode of the invention, the optimizing step is carried out under the same initial conditions as for the first adjustment data.

In accordance with yet an additional mode of the invention, the second adjustment data for fine-tuning of the clock signal is determined during the operation of the integrated circuit, for example, after the application of a supply voltage, by which a self-test procedure is started. During the self-test procedure, the optimization method is carried out and the second adjustment data, which is being determined with respect to fine adjustment of the internal clock signal, is stored in the read/write memory.

In accordance with a concomitant mode of the invention, the integrated circuit is to be separated into a plurality of integrated circuits and the first adjustment data is written before the plurality of integrated circuits are separated from one another.

Other features that are considered as characteristic for the invention are set forth in the appended claims.

Although the invention is illustrated and described herein as embodied in an adjustment circuit and method for tuning of a clock signal, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
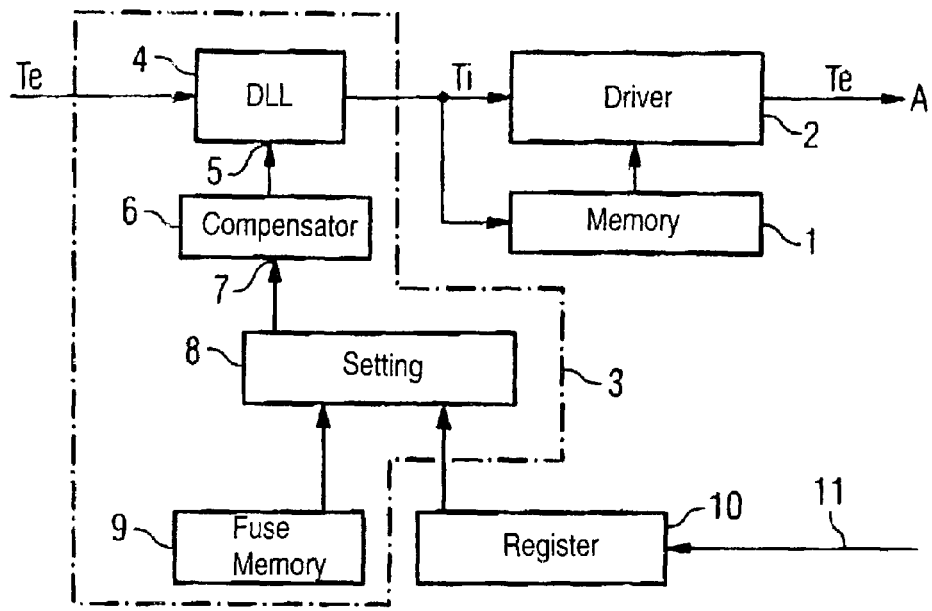
FIG. 1 is a block circuit diagram of an integrated circuit according to the invention with an embodiment of an adjustment circuit according to the invention.

Referring now to the figures of the drawings in detail and first, particularly to FIG. 1 thereof, there is shown a block circuit diagram of an integrated memory circuit. The integrated memory circuit has a memory area 1, which is connected to a driver apparatus 2 to read data from the memory area 1 and to provide the data as output data at the output A. The data at the output A is normally transferred using an external clock signal Te.

So that the memory data is produced at the output A substantially in synchronism with the external clock signal at the output A, an internal clock signal Ti must be generated, which is used to drive the memory area 1 and the driver apparatus 2, in order to emit the memory data at the output A in synchronism with the external clock signal Te. The internal clock signal Ti is, thus, phase-shifted with respect to the external clock signal Te, due to the delay in reading it from the memory area 1.

The phase shift between the external clock signal Te and the internal clock signal Ti is produced by an adjustment circuit 3. The adjustment circuit 3 has a Delay Locked Loop (DLL) 4, a compensating circuit 6, a setting circuit 8, and a fuse memory 9. The external clock signal Te is applied to one input of the DLL 4, and the internal clock signal Ti is emitted at one output of the DLL 4.

The DLL 4 shifts the phase of the external clock signal Te in accordance with a variable that is applied to a control input 5 of the DLL 4. The control input 5 of the DLL 4 is connected to the compensating circuit 6, which emits the adjustment variable to the control input 5 of the DLL 4 as a function of a digital setting value at an input 7 of the compensating circuit 6.

The fuse memory 9 and a test mode register 10 are connected to the setting circuit 8 so that the respectively stored data is available in the setting circuit 8. The setting value is generated in the setting circuit 8 by, first of all, linking the first adjustment data, which is stored in the fuse memory 9, to the second adjustment data, which is stored in the test mode register 10, in accordance with a predetermined function.

The second adjustment data is written to the test mode register 10 through an external bus 11. The second adjustment data is produced by a non-illustrated external test unit, with the second adjustment data being determined by the external test unit from the timings of the memory data, which is produced at the output A, and from the external clock signal Te.

The adjustment circuit must be tuned to set the internal clock signal Ti such that the memory data at the output A can be transferred reliably using the external clock signal Te. The memory data is transferred reliably when the internal clock signal Ti is set such that the memory data that is to be emitted has a maximum system margin, that is to say, such that the fluctuations in the phase between the external clock signal Te and the memory data that is to be emitted may be as great as possible without any error occurring during the transfer of the memory data at the output A.

According to the invention, the adjustment circuit is tuned in two steps.

After the processing of the integrated circuits on a substrate wafer, the integrated circuits are also tested on the substrate wafer before being sawed apart from one another. The testing is carried out by applying needle cards, by which the contact surfaces of the integrated circuits are connected to a test device.

The integrated circuits also have fuse memories, which can be set electrically or by a laser in accordance with setting data that is determined in the tester apparatus. Once a fuse memory has been written, it holds the data permanently and generally cannot be overwritten by new setting values.

The fuse memory 9 is associated with the adjustment circuit 3 and, during the front-end test; the test device determines first adjustment data, which is then written to the fuse memory 9. The first adjustment data is chosen such that the internal clock signal Ti produces memory data at the output A such that it can be transferred, substantially reliably, using the external clock signal at the output A. The accuracy of the tuning of the internal clock signal Ti depends on the resolution of the first adjustment data.

After the front-end test, the integrated circuits are separated, that is to say, the substrate wafer is divided up so that individual integrated circuits are produced, which are then normally inserted into housings, and are bonded. Such a process results in changes in the timing of the outputs of the integrated circuits as a result, for example, of signal delay times through the bonding wires or further parasitic effects. This makes it necessary to retune the internal clock signal Ti so that the memory data at the output A remains synchronized to the external clock signal Te. The aim is to define a relevant flank of the external clock signal Te such that it occurs as far as possible at an optimum position in a data eye of a memory data item, for example, at the time center of the data eye, at the output A. This optimum position can be determined by system analyses, that is to say, by using the integrated circuit in the respective system environment.

To carry out the fine-tuning, second adjustment data is written to the test mode register 10 through the data bus 11. The second adjustment data is determined by an optimization method, in which the timing of the external clock signal is compared with that of the memory data of the output A. Such an optimization procedure is carried out in a non-illustrated external test device that is connected to the test mode register 10 through the data bus 11. The optimization procedure is, preferably, iterative, with the second adjustment data being adapted until the relevant flank of the external clock signal Te is located at the optimum position in the data eye of the memory data of the output A.

The setting circuit 8 substantially links the first adjustment data from the fuse memory 9 to the second adjustment data from the test mode register 10 so that the first adjustment data forms the most significant bit setting values and the second adjustment data forms the least significant bit setting values. The compensating circuit 6 may, by way of example, be a D/A converter, at whose output an electrical voltage is emitted, which depends on the input value of the input 7. The electrical voltage of the output of the compensating circuit 6 is applied to the input 5 of the DLL 4, thus, controlling the phase shift between the external clock signal Te and the internal clock signal Ti.

Figure 2:
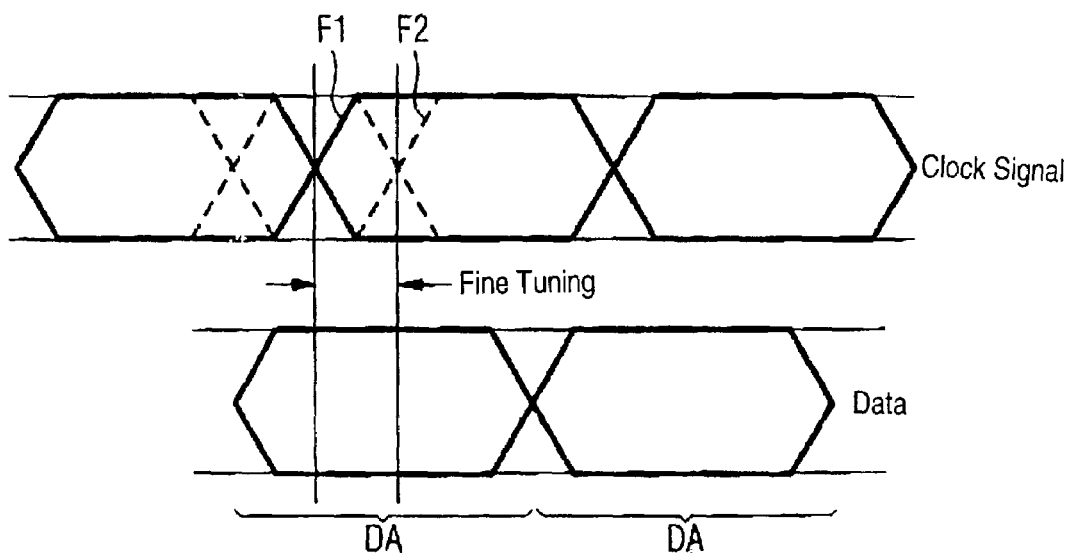
FIG. 2 is a timing diagram illustrating the tuning procedure according to the invention.

The method according to the invention is explained in more detail in FIG. 2, with reference to a timing diagram. During the tuning procedure in the front-end test, all that it is necessary to ensure is that the relevant flank F1 of the internal clock signal Ti substantially occurs within the data eye DA, such that data can be transferred, while the fine-tuning process ensures that the relevant flank F2 of the internal clock signal Ti occurs at the optimum position in a data eye, so that, as far as possible, there is no risk of disturbances in the phase between the memory data and the internal clock signal Ti as a result, for example, of jitter. If, on the other hand, the relevant flank F1 of the internal clock signal occurs offset to the side with respect to the optimum position of the data eye, then, for example, jitter can lead to it being impossible to transfer a data item.

It is, thus, possible, using the apparatus and the method according to the invention, to improve the reliability and the resistance of a clock production system to disturbances. It is likewise possible to change the second adjustment data in accordance with changes that occur to system parameters because it is possible to write to the test mode register 10 more than once. Thus, for example, a change in the timing of the memory circuit due to aging, temperature fluctuations, or similar effects can be taken into account by appropriately adapting the second adjustment data.

The features of the invention that are disclosed in the above description, in the claims and in the drawings may be significant to the implementation of the various embodiments of the invention both individually and in any desired combination.

I claim:

1. An integrated circuit for tuning emitted data, comprising:
   an adjustment circuit having:
     a read only memory storing first adjustment data;
     an internal clock signal; and
     a compensating circuit synchronizing said internal clock signal with respect to the data to be emitted;
   a read/write memory storing second adjustment data;
   said adjustment circuit adapted to:
     supply setting data dependent upon said first adjustment data and said second adjustment data; and
     tune said internal clock signal; and
   said adjustment circuit being constructed for applying said setting data to said compensating circuit.

2. The integrated circuit according to claim 1, wherein said read only memory has a settable fuse to be set during a test procedure.

3. The integrated circuit according to claim 1, wherein said read/write memory has a register containing test mode information during a test procedure.

4. The integrated circuit according to claim 2, wherein said read/write memory has a register containing test mode information during the test procedure.

5. The integrated circuit according to claim 1, wherein said adjustment circuit has a clock production circuit connected to said compensating circuit to match said internal clock signal to the data to be emitted.

6. An integrated circuit for tuning emitted data, comprising:
an adjustment circuit having:
a read only memory storing first adjustment data;
an internal clock signal; and
a compensatinp circuit synchronizing said internal clock signal with respect to the data to be emitted;
a read/write memory storing second adjustment data;
said adjustment circuit adapted to:
supply setting data dependent upon said first adjustment data and said second adjustment data; and
tune said internal clock signal; and
said adjustment circuit having a setting circuit connected to said compensating circuit for applying said setting data to said compensating circuit and for producing said setting data from said first adjustment data and from said second adjustment data in accordance with a predetermined function.

7. A method for tuning an internal clock signal with respect to data to be emitted in an integrated circuit, which comprises:
tuning the internal clock signal with respect to data to be emitted in a front-end test step;
determining first adjustment data;
storing the first adjustment data;
fine-tuning the internal clock signal with respect to the data to be emitted;
determining second adjustment data;
storing the second adjustment data; and
setting the internal clock signal as a function of the first adjustment data and the second adjustment data.

8. The method according to claim 7, which further comprises:
processing the first and second adjustment data in accordance with a function for setting data; and
tuning the internal clock signal with the setting data.

9. The method according to claim 7, which further comprises processing the first and second adjustment data in accordance with a function for setting data, by which the internal clock signal is tuned.

10. The method according to claim 7, which further comprises storing the first adjustment data in a nonvolatile manner.

11. The method according to claim 10, which further comprises storing the second adjustment data in a volatile manner.

12. The method according to claim 8, which further comprises storing the first adjustment data in a nonvolatile manner.

13. The method according to claim 12, which further comprises storing the second adjustment data in a volatile manner.

14. The method according to claim 7, which further comprises carrying out the step of fine-tuning the internal clock signal by optimizing the second adjustment data.

15. The method according to claim 14, which further comprises carrying out the optimizing step under the same initial conditions as for the first adjustment data.

16. The method according to claim 7, which further comprises carrying out the step of fine-tuning the internal clock signal during operation of the integrated circuit.

17. The method according to claim 7, wherein the integrated circuit is to be separated into a plurality of integrated circuits and which further comprises writing the first adjustment data before the plurality of integrated circuits are separated from one another.

18. An integrated circuit for tuning emitted data, comprising:
an adjustment circuit having:
a read only memory storing first adjustment data;
an internal clock signal;
a compensating circuit synchronizing said internal clock signal with respect to the data to be emitted;
a clock production circuit connected to said compensating circuit to match said internal clock signal to the data to be emitted; and
a setting circuit connected to said compensating circuit;
a read/write memory storing second adjustment data;
said setting circuit producing setting data from said first and second adjustment data in accordance with a predetermined function;
said adjustment circuit adapted to:
supply said setting data dependent upon said first adjustment data and said second adjustment data; and
tune said internal clock signal; and
said setting circuit applying said setting data to said compensating circuit.

* * * * *